United States Patent [19]

Friend et al.

[11] Patent Number: 5,247,190
[45] Date of Patent: Sep. 21, 1993

[54] ELECTROLUMINESCENT DEVICES

[75] Inventors: Richard H. Friend, Cambridge, United Kingdom; Jeremy H. Burroughes, New York, N.Y.; Donal D. Bradley, Cambridge, United Kingdom

[73] Assignees: Cambridge Research and Innovation Limited; Cambridge Capital Management Limited; Lynxvale Limited, all of Cambridge, England

[21] Appl. No.: 634,117
[22] PCT Filed: Apr. 18, 1990
[86] PCT No.: PCT/GB90/00584
§ 371 Date: Dec. 28, 1990
§ 102(e) Date: Dec. 28, 1990
[87] PCT Pub. No.: WO90/13148
PCT Pub. Date: Nov. 1, 1990

[30] Foreign Application Priority Data

Apr. 20, 1989 [GB] United Kingdom ............ 8909011.2

[51] Int. Cl.$^5$ ........................................... H01L 29/29
[52] U.S. Cl. ........................................ 257/40; 257/103; 313/504
[58] Field of Search ............... 357/8; 313/504, 506; 257/70, 103

[56] References Cited

U.S. PATENT DOCUMENTS

| | | | |
|---|---|---|---|
| 3,621,321 | 11/1971 | Williams et al. | 313/504 |
| 4,528,118 | 7/1985 | Murase | 252/500 |
| 4,539,507 | 9/1985 | Van Slyke et al. | 313/504 |
| 4,672,265 | 6/1987 | Eguchi et al. | 313/504 |

FOREIGN PATENT DOCUMENTS 0294061 7/1988 European Pat. Off.

OTHER PUBLICATIONS

"Optical Investigations of Conjugated Polymers", R. H. Friend; *Journal of Molecular Electronics*, vol. 4 (1988), pp. 37-46.
"Electroluminescence in Polyethylene Terephthalate (PET) I. Impulse Voltage", Kenzo Kojima, et al.; *Japanese Journal of Applied Physics*, vol. 2, No. 6 (Jun. 1982); pp. 860-864.
"A Biotech Route to Polyphenylene", Denis G. H. Ballard, et al.; *J. Chem. Soc.; Chem. Commun.*, 1983; pp. 954-955.
"Spectroscopic and Cyclic Voltammetric Studies of Poly(p-phenylene vinylene) Prepared from Two Different Sulphonium Salt Precursor Polymers", John D. Stenger-Smith, et al.; *Polymer*, Jun. 1989, vol. 30 (Conference issue).
"Precursor-Route Poly(p-phenylenevinylene): Polymer Characterisation and Control of Electronic Properties", D. D. C. Bradley; *J. Phys. D. (Applied Physics)*, vol. 20 (1987); p. 1389.
Bradley & Friend, *J. Phys.: Condens. Matter* 1, 3671-3678 (1989).
Hayashi et al., *Solid State Commun.* 61, 249-251 (1987).
Bradley & Friend, *J. Molecular Electronics*, 5, 19-24 (1989).

Primary Examiner—Sara W. Crane
Attorney, Agent, or Firm—Merchant, Gould, Smith, Edell, Welter & Schmidt

[57] ABSTRACT

An electroluminescent device comprises a semiconductor layer (4) in the form of a thin dense polymer film comprising at least one conjugated polymer, a first contact layer (5) in contact with a first surface of the semiconductor layer, and a second contact layer (3) in contact with a second surface of the semiconductor layer. The polymer firm (4) of the semiconductor layer has a sufficiently low concentration of extrinsic charge carriers that on applying an electric field between the first and second contact layers across the semiconductor layer so as to render the second contact layer positive relative to the first contact layer charge carriers are injected into the semiconductor layer and radiation is emitted from the semiconductor layer. The polymer film can be poly(p-phenyenevinylene) [PPV] of formula (I) wherein the phenylene ring may optionally carry one or more substituents each independently selected from alkyl (preferably methyl), alkoxy (preferably methoxy or ethoxy), halogen (preferably chlorine or bromine) or nitro.

14 Claims, 4 Drawing Sheets

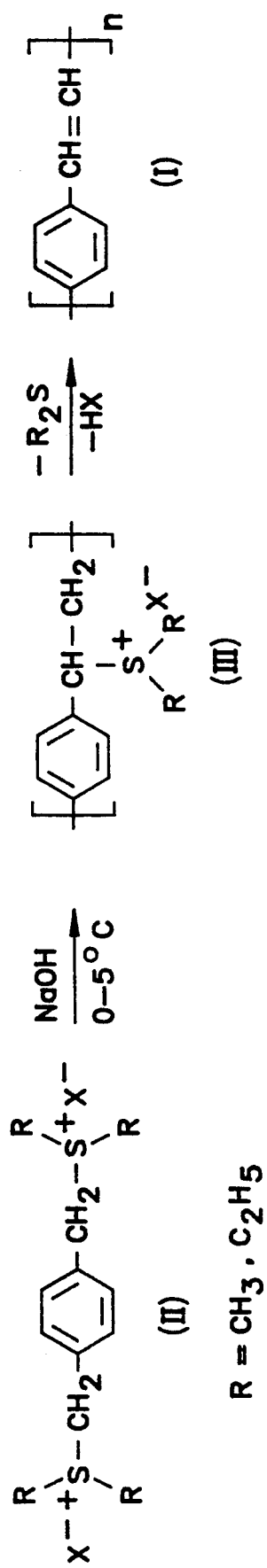
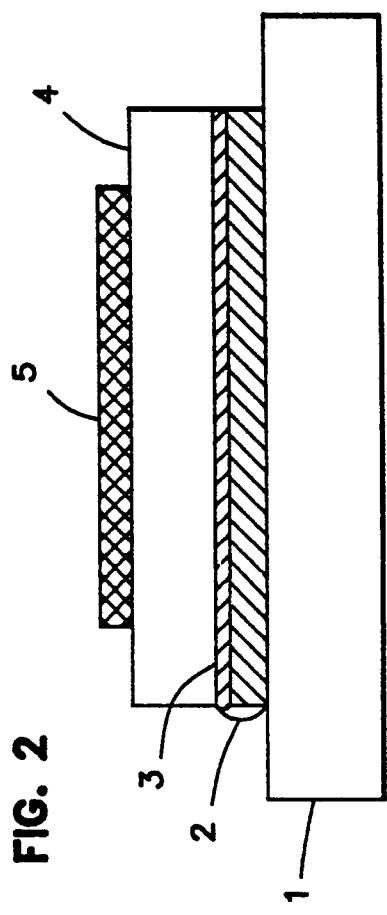
FIG. 1
FIG. 2

ELECTROLUMINESCENT DEVICES

FIELD OF THE INVENTION

The present invention relates to electroluminescent (EL) devices, and in particular EL devices in which the light-emitting layer is a semiconductor.

BACKGROUND OF THE INVENTION

Electroluminescent (EL) devices are structures which emit light when subject to an applied electric field. The usual model for the physical process in a semiconductor used in this way is through the radiative combination of electron-hole pairs which are injected into the semiconductor from opposite electrodes. Common examples are light-emitting diodes based on Gap and similar III-V semiconductors. Though these devices are efficient and widely used, they are limited in size, and are not easily or economically used in large area displays. Alternative materials which can be prepared over large areas are known, and among the inorganic semiconductors most effort has been directed to ZnS. This system has considerable practical drawbacks, primarily poor reliability. The mechanism in ZnS is believed to be one where acceleration of one type of carrier through the semiconductor under a strong electric field causes local excitation of the semiconductor which relaxes through radiative emission.

Among organic materials, simple aromatic molecules such as anthracene, perylene and coronene are known to show electroluminescence. The practical difficulty with these materials is, as with ZnS, their poor reliability, together with difficulties in deposition of the organic layers and the current-injecting electrode layers. Techniques such as sublimation of the organic material suffer from the disadvantage that the resultant layer is soft, prone to recrystallisation, and unable to support high temperature deposition of top-contact layers. Techniques such as Langmuir-Blodgett film deposition of suitably-modified aromatics suffer from poor film quality, dilution of the active material, and high cost of fabrication.

An electroluminescent device utilising anthracene is disclosed in U.S. Pat. No. 3,621,321. This device suffers from high power consumption and low luminescence. In an attempt to provide an improved device, U.S. Pat. No. 4,672,265 describes an EL device having a double layer structure as its luminescent layer. However, the suggested materials for the double layer structure are organic materials which suffer from the disadvantages mentioned above.

SUMMARY OF THE INVENTION

The present invention seeks to provide an electroluminescent device in which the above mentioned drawbacks are obviated or at least mitigated.

The present invention provides in one aspect an electroluminescent device comprising a semiconductor layer in the form of a thin dense polymer film comprising at least one conjugated polymer, a first contact layer in contact with a first surface of the semiconductor layer, and a second contact layer in contact with a second surface of the semiconductor layer, wherein the polymer film of the semiconductor layer has a sufficiently low concentration of extrinsic charge carriers that on applying an electric field between the first and second contact layers across the semiconductor layer so as to render the second contact layer positive relative to the first contact layer charge carriers are injected into the semiconductor layer and radiation is emitted from the semiconductor layer.

The invention is based on the discovery by the present inventors that semiconductive conjugated polymers can be caused to exhibit electroluminescence by the injection of charge carriers from suitable contact layers.

Semiconductive conjugated polymers per se are known. For example, their use in an optical modulator is discussed in EP-A-0294061. In that case, polyacetylene is used as the active layer in a modulating structure between first and second electrodes. It is necessary to place an insulating layer between one of the electrodes and the active layer so as to create a space charge region in the active layer which gives rise to the optical modulation effect. Such a structure could not exhibit electroluminescence since the presence of the space charge layer precludes the formation of electron/hole pairs whose decay gives rise to radiation. It will be clear in any event that the exhibition of electroluminescence in EP-A-0294061 would be wholly undesirable since the optical modulation effect would be disrupted thereby.

In the device of the present invention, the conjugated polymer is preferably poly (p-phenylenevinylene) [PPV] and the first charge injecting contact layer is a thin layer of aluminium one surface having formed a thin oxide layer, the first surface of the semiconducting layer being in contact with the said oxide layer and the second charge injecting contact layer is a thin layer of aluminium or gold.

In another embodiment, the conjugated polymer is PPV, the first contact layer is aluminium or an alloy of magnesium and silver and the second contact layer is indium oxide.

In yet another embodiment, the conjugated polymer is PPV and one of the contact layers is non-crystalline silicon and the other of the contact layers is selected from the group consisting of aluminium, gold, magnesium/silver alloy and indium oxide.

These embodiments can be made by putting down either the first contact layer or the second contact layer onto a substrate, applying a thin film of PPV and then putting down the other of the first and second contact layers.

Preferably the polymer film is of substantially uniform thickness in the range 10 nm to 5 $\mu$m and the conjugated polymer has a semiconductor band gap in the range 1 eV to 3.5 eV. Furthermore the proportion of the conjugated polymer in the electroluminescent areas of the polymer film is sufficient to achieve the percolation threshold for charge transport in the conjugated polymer present in the film.

A second aspect of the present invention provides a method of manufacture of an electroluminescent device wherein a semiconductor layer in the form of a thin layer of a dense polymer film comprising at least one conjugated polymer is deposited onto a substrate by the steps of depositing a thin layer of a precursor polymer as a thin polymer film onto the substrate and then heating the deposited precursor polymer to a high temperature to form the conjugated polymer, a thin layer of a first contact layer being placed in contact with a first surface of the semiconductor layer and a thin layer of a second contact layer being placed in contact with a second surface of the semiconductor layer, wherein the polymer film has a sufficiently low concentration of extrinsic charge carriers that on applying an electric field between the first and second contact layers once in contact with the semiconductor layer so as to render the second contact layer positive relative to the first contact layer charge carriers are injected into the semiconductor layer and radiation emitted from the semiconductor layer.

By conjugated polymer is meant a polymer which possesses a delocalised π-electron system along the polymer backbone; the delocalised π-electron system confers semiconducting properties to the polymer and gives it the ability to support positive and negative charge carriers with high mobilities along the polymer chain. Such polymers are discussed for example by R. H. Friend in Journal of Molecular Electronics 4 (1988) January–March, No. 1, pages 37 to 46.

It is believed that the mechanism underlying the present invention is such that the positive contact layer injects positive charge carriers into the polymer film and the negative contact layer injects negative charge carriers into the polymer film, these charge carriers combining to form charge carrier pairs which decay radiatively. To achieve this, preferably the positive contact layer is selected to have a high work function and the negative contact layer to have a low work function. Hence the negative contact layer comprises an electron-injecting material, for example a metal or a doped semiconductor that, when placed in contact with the polymer semiconductor layer and made negative with respect to the polymer semiconductor through application of an external potential across the circuit, allows the injection of electrons into the polymer semiconductor layer. The positive contact layer comprises a hole-injecting material, for example a metal or a doped semiconductor that, when placed in contact with the polymer semiconductor layer and made positive with respect to the polymer semiconductor through application of an external potential across the circuit, allows the injection of positive charges, commonly termed "holes", into the polymer semiconductor layer.

In order to produce the desired electroluminescence, the polymer film must be substantially free of defects which act as non-radiative recombination centres, since such defects prevent electroluminescence.

By "dense" polymer film is meant that the polymer film is not fibrillar and is substantially free of voids.

One or each of the contact layers can include, in addition to the layer of charge injecting material, a further layer of a material, preferably an organic material, which serves to control the injection ratio of electrons and holes into the EL layer and to ensure that radiative decay takes place away from the charge injecting material of the contact layers.

The film of conjugated polymer preferably comprises a single conjugated polymer or a single co-polymer which contains segments of conjugated polymer. Alternatively, the film of conjugated polymer may consist of a blend of a conjugated polymer or copolymer with another suitable polymer.

Further preferred features of the polymer film are that:

(i) the polymer should be stable to oxygen, moisture, and to exposure to elevated temperatures;

(ii) the polymer film should have good adhesion to an underlying layer, good resistance to thermally-induced and stress-induced cracking, and good resistance to shrinkage, swelling, recrystallisation or other morphological changes;

(iii) the polymer film should be resilient to ion/atomic migration processes, e.g. by virtue of a high crystallinity and high melting temperature.

Embodiments of the present invention will now be described by way of example only, with reference to the accompanying drawings.

The film of conjugated polymer is preferably a film of a poly(p-phenylenevinylene) [PPV] of formula

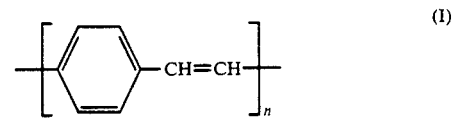

(I)

wherein the phenylene ring may optionally carry one or more substituents each independently selected from alkyl (preferably methyl), alkoxy (preferably methoxy or ethoxy), halogen (preferably chlorine or bromine), or nitro.

Other conjugated polymers derived from poly(p-phenylenevinylene) are also suitable for use as the polymer film in the EL devices of the present invention. Typical examples of such derivatives are polymers derived by:

(i) replacing the phenylene ring in formula (I) with a fused ring system, e.g. replacing the phenylene ring with an anthracene or naphthalene ring system to give structures such as:

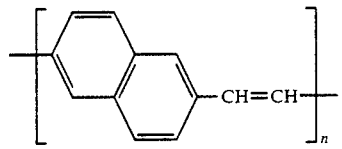

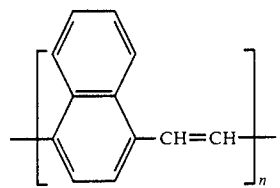

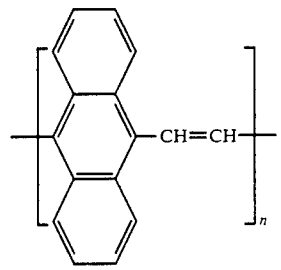

These alternative ring systems also carry one or more substituents of the type described above in relation to the phenylene ring.

(ii) replacing the phenylene ring with a heterocyclic ring system such as a furan ring to give structures such as:

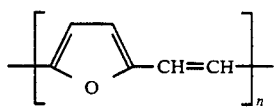

As before, the furan ring may carry one or more substituents of the type described above in relation to phenylene rings.

(iii) increasing the number of vinylene moieties associated with each phenylene ring (or each of the other alternative ring systems described above in (i) and (ii)) to give structures such as:

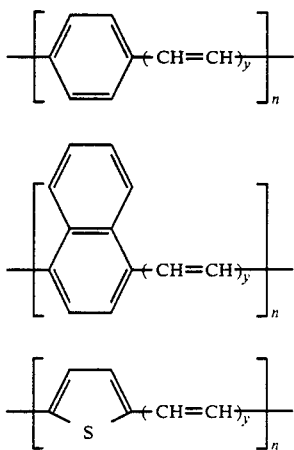

wherein y represents 2, 3, 4, 5, 6, 7, . . . .

Once again, the ring systems may carry the various substituents described above.

These various different PPV derivatives will possess different semiconductor energy gaps; this should permit the construction of electroluminescent devices which have emission at different wavelengths covering the entire visible part of the spectrum.

The film of conjugated polymer may be prepared by means of a chemical and/or thermal treatment of a solution—processible or melt-processible "precursor" polymer. The latter can be purified or pre-processed into the desired form before subsequent transformation to the conjugated polymer via an elimination reaction.

Films of the various derivatives of PPV described above can be applied onto a conducting substrate in similar manner by using an appropriate sulphonium precursor.

In certain circumstances it may be advantageous to use polymer precursors which have a higher solubility in organic solvents than the sulphonium salt precursors (II). Enhanced solubility in organic solvents can be achieved by replacing the sulphonium moiety in the precursor by a less hydrophilic group such as an alkoxy group (usually methoxy), or a pyridinium group.

Typically, a film of poly(phenylinevinylene) is applied onto a conducting substrate by a method which relies on a reaction scheme such as is illustrated in FIG. 1. The sulphonium salt monomer (II) is converted into a precursor polymer (III) in aqueous solution or in a solution of methanol/water, or methanol. Such a solution of the pre-polymer (III) can be applied onto a conducting substrate by means of standard spin-coating techniques as used in the semiconductor industry for photoresist processing. The resultant film of precursor-polymer III can then be converted into poly(phenylene vinylene) (I) by heating to temperatures typically in the range 200°–350° C.

Details of the conditions necessary for the chemical synthesis of the monomer (II), its polymerisation to the precursor (III) and its thermal conversion to PPV are described in the literature, for example in D. D. C. Bradley, J. Phys. D (Applied Physics) 20, 1389 (1987); and J. D. Stenger Smith, R. W. Lenz and G. Wegner, Polymer 30, 1048 (1989).

We have found that with poly(phenylenevinylene) films of a thickness in the range 10 nm to 10 micrometers can be obtained. These PPV films are found to have very few pin holes. The PPV film has a semiconductor energy gap of about 2.5 eV (500 nm); it is robust, shows little reaction with oxygen at room temperature, and is stable out of air at temperatures well in excess of 300° C.

Enhanced ordering in the conjugated material may be achieved by modifying the leaving group of the precursor polymer to ensure that the elimination proceeds smoothly via a simple reaction without generation of additional intermediate structures. Thus, for example, the normal dialkyl sulphonium moiety can be replaced with a tetrahydrothiophenium moiety. The latter eliminates as a single leaving group without decompositon, as is seen for dialkyl sulphide, into an alkyl mercaptan. In the examples described here, the precursor polymers used include both that with the dialkyl sulphonium moiety chosen as dimethyl sulphide and as tetratryebrothiophene. Both precursors produce film of PPV suitable for use in the device structures shown in examples below.

A further material which may be suitable for forming the film of conjugated polymer is poly(phenylene).

This material may be prepared by starting from biologically synthesised derivatives of 5,6-dihydroxycyclohexa-1,3-dienes. These derivatives can be polymerised by use of radical initators into a polymer precursor that is soluble in simple organic solvents. This preparation of poly(phenylene) is more fully described in Ballard et al, J. Chem. Soc. Chem. Comm. 954 (1983). A solution of the polymer precursor can be spin coated as a thin film onto a conducting substrate and then be converted to the conjugated poly(phenylene) polymer by a heat treatment, typically in the range 140° to 240° C.

Copolymerisation with vinyl or diene monomers can also be performed so as to obtain phenylene copolymers.

A further category of materials which can be used to form the required film of conjugated polymer is a conjugated polymer which is itself either solution processible or melt processible by virtue of the presence of bulky pendant side groups attached to the main conjugated chain or by virtue of the inclusion of the conjugated polymer into a copolymer structure of which one or more components are non-conjugated. Examples of the former include:

(a) Poly(4,4'-diphenylenediphenylvinylene) [PDPV] is an arylene vinylene polymer in which both vinylene carbons are substituted by phenyl rings. It is soluble in common organic solvents thus enabling the preparation of thin films.

(b) Poly(1,4-phenylene-1-phenylvinylene) and poly(1,4-phenylenediphenylvinylene) polymers are analogues of PPV in which respectively one and both vinylene carbons are substituted with phenyl groups.

They are both soluble in organic solvents and may be cast or spun into thin film form.

(c) Poly(3-alkylthiophene) polymers (alkyl is one of propyl, butyl, pentyl, hexyl, heptyl, octyl, decyl, undecyl, dodecyl etc) which are solution processible in common organic solvents and which for longer alkyl sequences (alkyl greater than or equal to octyl) are also melt processable.

(d) Poly(3-alkylpyrrole) polymers which are expected to be similar to the poly(3-alkylthiophene) polymers.

(e) Poly(2,5-dialkoxy-p-phenylenevinylene) polymers with alkyl greater than butyl are solution processible.

(f) Poly(phenylacetylene) is a derivative of polyacetylene in which the hydrogen atoms along the chain are replaced by phenyl groups. This substitution renders the material soluble.

In some circumstances it may also be appropriate to form polymer blends of the conjugated polymer with other polymers so as to obtain the required processibility of the polymer and thereby facilitate forming of the required thin uniform films of the polymer on the conducting substrate (the charge injecting contact layer).

When such copolymers or polymer blends are used to form the film of conjugated polymer, the active region of the electroluminescent device which incorporates the said film of conjugated polymer must contain a volume fraction of conjugated polymer which is greater than or equal to the percolation threshold of the copolymer or polymer blend.

The semiconductor electroluminescent layer may be formed as a composite layer with layers of polymers with different band gaps and/or majority charge species so that, for example, concentration of the injected charge, from the charge injecting contact layer, within a particular region of the EL device may be achieved. Composite layers may be fabricated by successive deposition of polymer layers. In the case where films are deposited in the form of the precursor by spin- or draw-coating to the conjugated polymer, the conversion process to the conjugated polymer renders the film insoluble, so that subsequent layers may be similarly applied without dissolution of the previously deposited film.

BRIEF DESCRIPTION OF THE DRAWINGS

For a better understanding of the present invention, and to show how the same may be carried into effect, reference will now be made, by way of example, to the accompanying drawings in which:

FIG. 1 is a formulae drawing showing a reaction scheme for laying down the conjugated polymer;

FIGS. 2 and 3 are sketches of an electroluminescent device in accordance with the present invention;

DESCRIPTION OF THE PREFERRED EMBODIMENTS

Example 1

Figure 3:
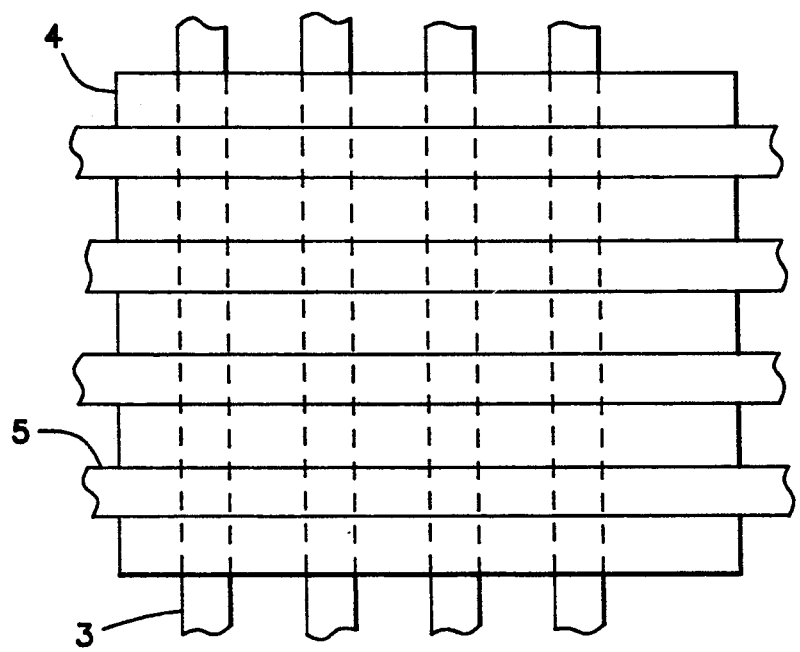

Referring now to FIGS. 2 and 3 an EL device was constructed as follows:

Onto the upper surface of a substrate of glass for example a silica or borosilicate glass 1 of approximately 1 mm thickness, a first charge injecting contact layer 2 was formed. The charge injecting contact layer was formed by thermal evaporation of aluminium through a shadow-mask resulting in a layer of approximately 20 nm in thickness. The shadow-mask was used to define a pattern which was a series of parallel strips of width 2 mm, separation 2 mm and length 15 mm. The resulting aluminium charge injecting contact layer was then exposed to the air to allow formation of a thin surface oxide layer 3. This then formed the electron injecting contact layer.

A solution of the precursor to PPV, in methanol, having a concentration in the range 1 gram polymer to 10 to 25 ml of methanol, was spin-coated onto the combination substrate described above. This was achieved by spreading the polymer solution over the whole surface of the combination substrate and then spinning the substrate, held with its upper surface horizontal, about a vertical axis at speeds of up to 5000 r.p.m. The resultant substrate and precursor polymer layer was then heated in a vacuum oven at a temperature of 300° C. for 12 hours. This heat treatment converted the precursor polymer to PPV, and the resultant PPV film 4 had a thickness in the range 100 to 300 nm. The minimum requirements for the film thickness is set by the film conductance and a lower limit is in the region of 20 nm. However, the preferred range of thickness is 20 nm to 1 $\mu$m.

A second charge injecting contact layer (5) was then formed by the evaporation of gold or aluminium onto the PPV film. A shadow mask was again used to define a pattern on the surface of the PPV film so that a series of parallel strips of width 2 mm, separation 2 mm and length 15 mm was formed rotated at right angles to the first charge injecting contact layer strips. The thickness of the second charge injecting contact layer was in the range 20–30 nm. This then formed the hole-injecting contact layer.

It is preferable that at least one of the charge injecting contact layers is transparent or semitransparent in order to allow light emission from the EL device perpendicular to the plane of the device. This is achieved here with aluminium and gold layers of a thickness not exceeding 30 mm. For a device with the thickness of the PPV layer about 200 nm, the threshold voltage for charge injection and the appearance of strong electroluminescence is about 40 volts. The voltage gives a threshold electric field of $2 \times 10^6$ Vcm$^{-1}$. At a current density of 2 mA/cm$^2$ the light emission through the semitransparent electrodes was visible by eye under normal lighting conditions. The output of the device showed only weak dependance on frequencies up to 100 kHz. This demonstrates that the response time of the EL device is very short and is faster than 10 microseconds. When in use the EL device was operated in air with no special precautions taken and exhibited no obvious indications of degradation.

Figure 4:
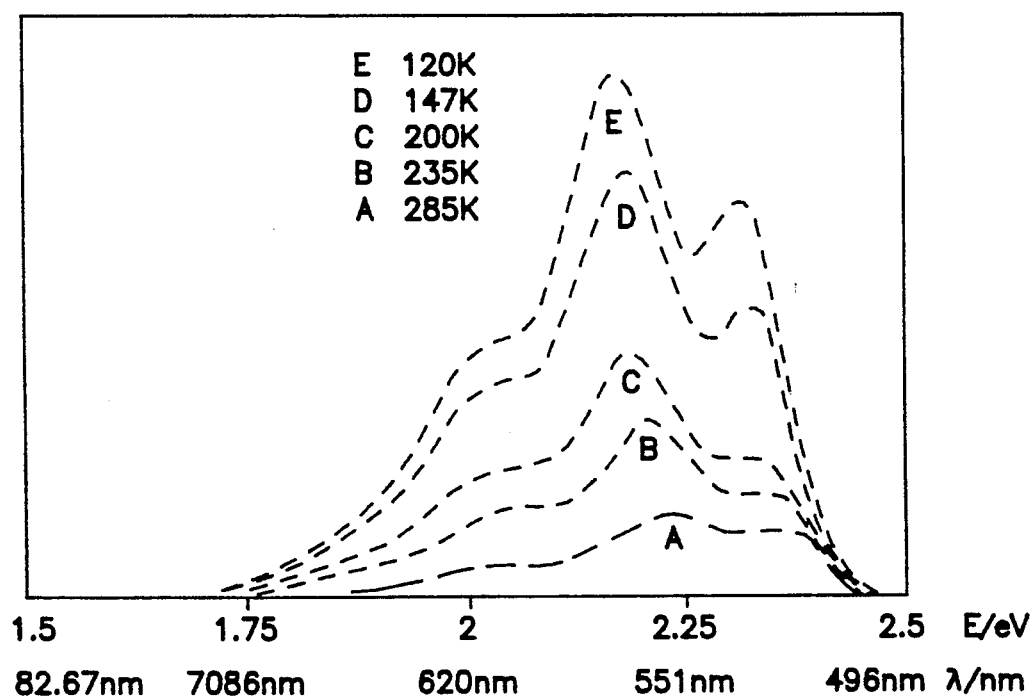
FIG. 4 is a graph of the electroluminescent output of the device described with reference to FIGS. 2 and 3.

The light output from the device was spectrally resolved with a grating monochromator and detected with a silicon photovoltaic cell, and measurements were performed both at room temperature (20° C.) and also with the device held in a cryostat with optical access, at low temperatures. Results are shown in FIG. 4. The EL spectrum shows light output over the spectral range 690 to 500 nm (1.8 to 2.4 eV) with peaks separated by about 0.15 eV which shift in position a little with temperature.

Other materials which are suitable for use as an electron-injecting contact layer because they have a low work function relative to the EL layer are: n-doped silicon (amorphous or crystalline), silicon with an oxide coating, alkali and alkaline-earth metals either pure or alloyed with other metals such as Ag. Also thin layers of "n-type doped" conjugated polymers may be interposed between a metallic layer and the electroluminescent polymer layer to form the electron-injecting contact layer.

Other materials which are suitable for use as a hole-injecting contact layer because they have a high work function relative to the EL layer are: indium/tin oxides (which are transparent in the visible part of the spectrum), platinum, nickel, palladium and graphite. Also thin layers of "p-type doped" conjugated polymers, such as electrochemically polymerised polypyrrole or polythiophene may be interposed between a metallic layer and the electroluminescent polymer layer to form the hole-injecting contact layer.

The above mentioned materials may be applied as follows: all metals except those with very high melting point temperatures such as platinum may be deposited by evaporation; all metals including indium oxide may be deposited using DC or RF sputtering and also electron beam evaporation; for amorphous silicon deposition may be done by glow-discharge deposition from mixtures of silane and dopants such as phosphine.

The following are some examples of structures using these materials.

Example 2

The structure for this example is built up as a series of layers on a glass substrate. First, a layer of conducting but transparent indium oxide was deposited onto the substrate by a process involving ion-beam sputtering from an indium target in the presence of oxygen.

Samples are prepared in cryopumped system with a base pressure of $10^{-8}$ mbar The substrate is water-cooled, remaining at room temperature for all depositions used here. Ion-beam sputtering from an indium target at deposition rates of typically 0.1 nm/sec, in the presence of an oxygen pressure of typically $2 \times 10^{-4}$ mbar, produced films of transparent indium oxide with resistivities of typically $5 \times 10^{-4}$ $\Omega$cm. Typical thicknesses of 100 nm give specific sheet resistances of about $50\Omega$ per square. Such films have optical transmission coefficients in the visible portion of the spectrum of better than 90%.

These films have an amorphous structure, as determined from X-ray and electron diffraction measurements.

A layer of PPV is next deposited onto the indium oxide layer, using the procedure described in example 1 above. A top contact of aluminium is finally deposited by evaporation, typically to a thickness of 50 nm. This structure is operated with the indium oxide contact layer functioning as the positive contact, and the aluminium contact as the negative contact. Light emission is viewed through the indium oxide layer.

Figure 5:
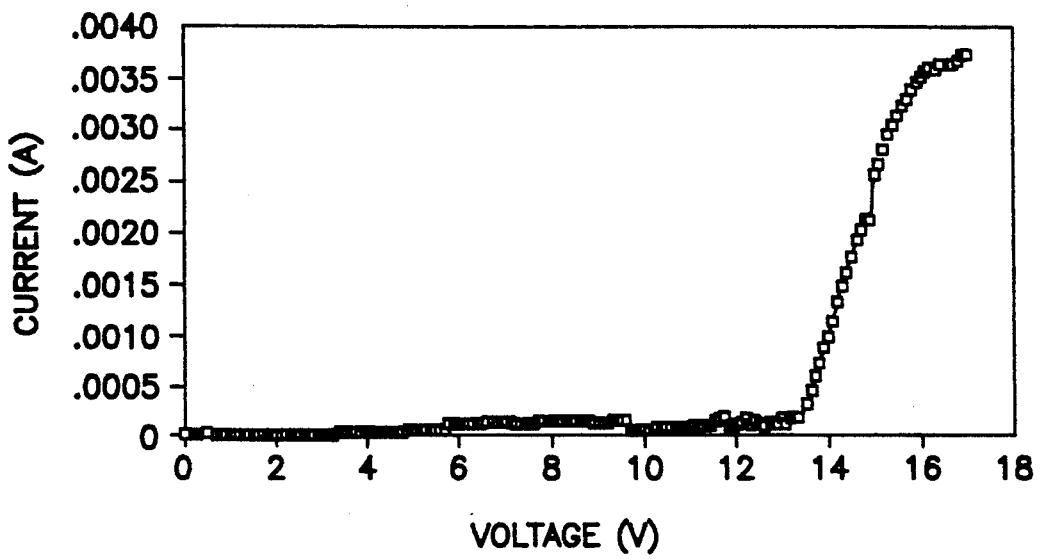
FIGS. 5 and 6 are graphs of current flow VS light emission, and output intensity VS applied voltage, respectively for an electroluminescent device according to another example of the invention.
Figure 6:
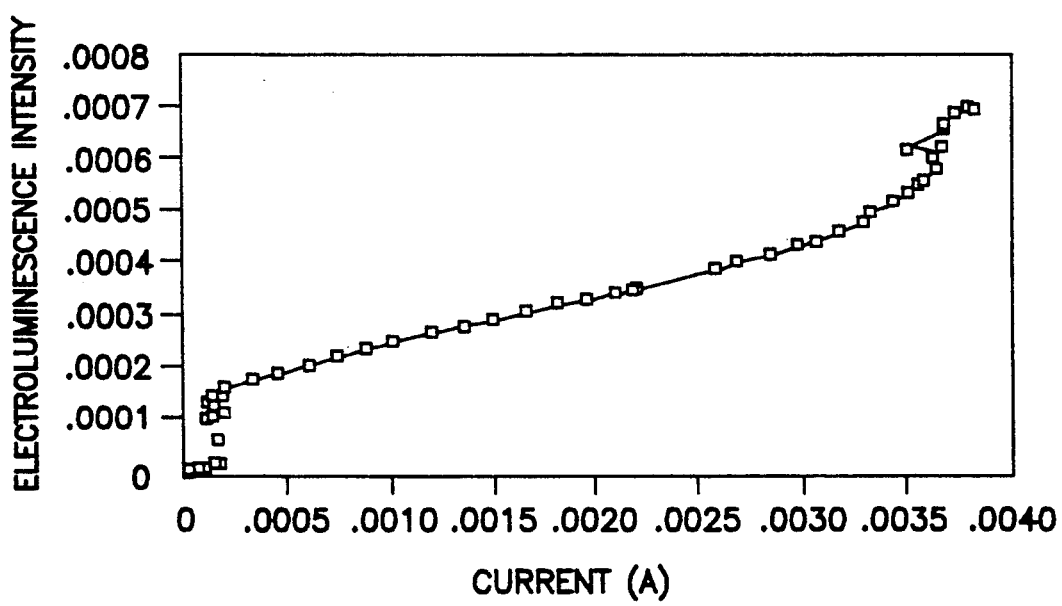

Results for a structure constructed this way, with a layer of PPV of thickness 70 nm, and an active area of 2 mm² are shown in FIGS. 5 and 6. The threshold for current flow associated with light emission is seen to be at about 14 V in FIG. 5. The variation in the intensity of the spectrally-integrated light output for the device is shown as a function of current in FIG. 6.

Example 3

The fabrication of this structure is as for Example 2 above up to the top metal contact. Here, we deposit by evaporation an alloy of silver and magnesium to form the top contact which acts as the negative contact. The evaporation is performed by heating a mixture of silver and magnesium powders in a molar ration of 1 to 10 in a boat, and film thicknesses of typically 50 nm were deposited.

Magnesium is desirable as a material for the negative electrode as it has a low work function. The addition of silver to form an alloy improves the adhesion of the metal film to the polymer layer, and improves its resistance to oxidation. The current/voltage and EL properties of these samples were similar to those described in Example 2.

Example 4

These structures were fabricated with a layer of amorphous silicon-hydrogen alloy acting as the negative electrode, and indium oxide as the positive electrode. A glass substrate is used with an evaporated Metal contact layer of aluminium or chromium. The amorphous silicon-hydrogen film was then deposited by radio-frequency, RF, sputtering as detailed below.

The RF sputterer used has two targets, a liquid Nitrogen cooled getter and is operated with a target-substrate separation of 8 cm. The chamber has a base pressure of $5 \times 10^{-8}$ mbar. Magnetron targets are loaded with layers of n-doped Si wafers to a thickness of 3 mm. The targets are cleaned by presputtering for 1-2 hours prior to sample deposition. Substrates prepared as above are radiatively heated so that the temperature at the back side of the 3 cm thick Cu and Al substrate plate is at 250°-300° C. Substrates are rotated at about 6 revs/min. The sputtering gas used is 30% $H_2$ in Ar, at a pressure of 0.007-0.013 mbar, and is continually passed through the chamber during deposition. The RF power used is 250 W with a reflected power of 2 W. Deposition rates are typically 12 nm/min giving deposition times of 1.5 hours for film thicknesses of 1 $\mu$m.

The resulting amorphous Si is reddish brown in colour and has a d.c. resistivity of between $5 \times 10^6$ and $5 \times 10^8$ $\Omega$cm. [This found by evaporating two Al pads, either above or below the sample, of length 3 mm and with a separation of 0.25 mm and measuring the resistance between these two contacts].

A layer of PPV was then applied to the amorphous silicon-hydrogen layer, as described in Example 1 above, and this was followed with a layer of indium oxide, deposited directly onto the PPV layer, using the procedure described in Example 2.

Figure 7:
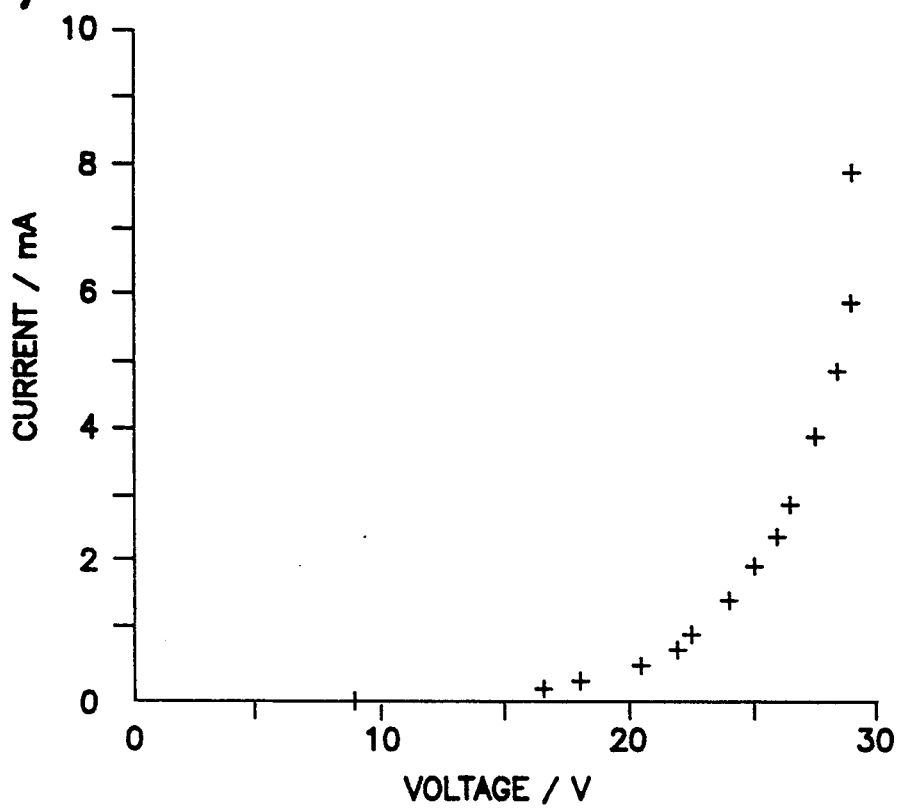
FIGS. 7 and 8 are graphs respectively of the current output and electroluminescent intensity of a further example of the invention.
Figure 8:
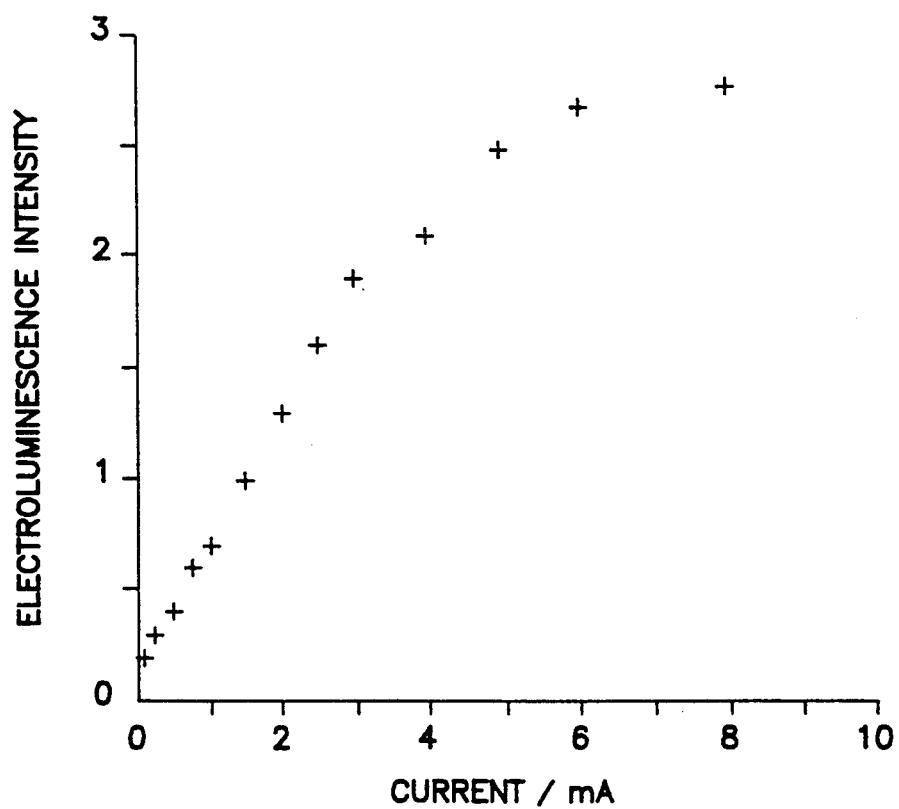

Results obtained for a structure fabricated using the steps outlined above are shown in FIGS. 7 and 8 for a structure of area 14 mm², and layer thicknesses of 1 $\mu$m for the silicon-hydrogen, 40 nm for the PPV and 250 nm for the indium oxide. FIG. 7 shows the current versus voltage characteristic for the device in forward bias (indium oxide positive), and FIG. 8 shows the variation in integrated light output with current. The onset of charge injection and light emission is at about 17 V, and the rise in current above this threshold is, due to the presence here of the resistive silicon-hydrogen layer, more gradual than observed in structures without it, as seen for example in FIG. 5.

Structures of this type did also show weaker EL in reverse bias (indium oxide contact negative with respect to the silicon-hydrogen contact). The preferred mode of operation, however, is in forward bias.

Example 5

Fabrication as in example 4, but with the top layer of indium oxide replaced by a layer of semitransparent gold or aluminium. Structures fabricated with the top layer of thickness about 20 nm showed EL through this top contact. These devices showed similar characteristics to the examples discussed above.

The method of fabrication of Example 4 could also be used with the contact layers described in Examples 2 and 3.

There are other methods, known per se, for depositing silicon/hydrogen layers and indium oxide layers. For silicon this could include glow discharge of silane and evaporation. For indium oxide other possibilities include tin with the indium, to form indium tin oxide (ITO), which has very similar electrical properties to the indium oxide that we have used here. Deposition methods include evaporation, RF and DC sputtering.

The choice of thickness for the charge injecting contact layers will be determined by the deposition technique used and also the desired optical transparency of the contact layer. The ease of charge injection may be improved by constructing the charge injecting contact layers as composites. Such composites would incorporate thin layers of oxidised and reduced conjugated polymers for hole and electron injection respectively. These extra layers of conjugated polymer may or may not be the same as the active electroluminescent polymer layer. Methods of doping such materials are well known in the field and are clearly described in "Handbook of Conducting Polymers" T. J. Skotheim.

Although in certain circumstances it is preferable that at least one of the charge injecting contact layers is transparent or semitransparent in order to allow emission of radiation perpendicular to the plane of the device it is not necessarily the case for example when emission within the plane of the device only is required.

The limit to the size of the EL device produced is determined by the size of the substrate which can be used for spin-coating. For example, 15 cm diameter silicon wafers have been coated in this way. To coat much larger areas, techniques such as draw-coating may be used instead. It is therefore feasible that EL devices using conjugated polymers with areas of square meters may be constructed.

At least some of the conjugated polymers, including PPV, are capable of withstanding post-processing such as the deposition of metal layers in which the deposition is required to be at very high temperatures for evaporation, or the deposition of amorphous silicon layers, followed by photolithographic processes for the definition of active electroluminescent areas. Although it is preferable, with the use of PPV, for either spin- or draw-coating to be used as the methods for applying the precursor polymer to the substrate depending upon the conjugated polymer and the type of EL device required spin-, draw-coating and melt-processing are all methods which may be used to deposit the conjugated polymer onto the substrate.

The EL device may be used in a variety of ways where electroluminescence is of use. It may be used where semiconductor LED's have traditionally been used. It may also be used where traditionally liquid crystals have been used, the EL device having many properties which make it a desirable alternative to liquid crystals.

Since the EL device is light-emitting in contrast to liquid crystal displays, the viewing angle is wide. Furthermore, large area EL devices can be achieved where problems associated with substrate flatness and spacing have been encountered with large area liquid crystal displays. The EL devices are particularly suitable for matrix-addressed displays for example televisions and computer displays. An example of electroluminescent devices for use in a matrix-addressed displays is shown in FIG. 3 where the charge injecting contact layers are applied in strips, either side of the semiconductor layer, the strips of one contact layer being orthogonal to the strips of the other contact layer. The matrix-addressing of individual EL devices or areas of the semiconductor layer called pixels of the display is achieved by the selection of a particular strip in the lower charge injecting contact layer and a particular strip, at right angles to the first strip, in the upper charge injecting contact layer. Furthermore since the EL device has such a high speed of response then the EL device is suitable for use as a television screen, particularly since the colour of the emitted light may be controlled through the choice of the conjugated polymer and so its semiconductor band gap and so colour displays using green, red and blue pixels, suitable for colour mixing, are possible through the location of different conjugated polymers in the EL device.

Industrial application

EL devices may also be used as individual shaped elements for indicators in vehicle dashboards, on cookers or video recorders for example. Each element may be produced in the required shape for the intended application. Furthermore the EL device need not be flat and could, for example, be formed after fabrication, to follow contours in three dimensions for example the contours of a windscreen in a vehicle or aircraft. For such use the precursor polymer would have to be applied to a suitable substrate such as transparent polymer film such as polyester, polyvinylidene fluoride or polyimide. If the precursor polymer is applied to such flexible polymer films then continuous fabrication of the EL device, onto a roll, is possible. Alternatively the precursor polymer may be applied, using for example a draw-coating process, onto a pre-fabricated contoured substrate.

Finally use of the EL devices is envisaged in optical communications where the EL device may be fabricated directly onto a prepared structure to act as a light source with efficient optical coupling of the EL device with optical fibres and/or thin-film waveguides. A similar application is described in an article by Satoshi Ishihara in Science and Technology in Japan of July 1989, pages 8 to 14 entitled "Optical Information Processing".

EL device light sources may be suitable for use as lasers.

What is claimed is:

1. An electroluminescent device comprising:

a semiconductor layer in the form of a thin dense polymer film comprising at least one conjugated polymer;

a first contact layer which is selected so that on application of an electric field to said device charge carriers of a first type are injected into the semiconductor layer; and a second contact layer which is selected so that on application of an electric field to said device charge carriers of a second type are injected into the semiconductor layers, wherein the polymer film of the semiconductor layer has a sufficiently low concentration of extrinsic charge carriers that on applying an electric field between the first and second contact layers across the semiconductor layer so as to render the second contact layer positive relative to the first contact layer charge carriers of said first and second types are injected into the semiconductor layer and combine to form in the conjugated polymer charge carrier pairs which decay radiatively so that radiation is emitted from the conjugated polymer.

2. An electroluminescent device as claimed in claim 1, wherein the conjugated polymer is poly(p-phenylenevinylene) [PPV] of formula

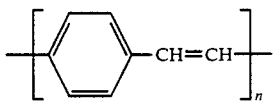

(I)

wherein the phenylene ring may optionally carry one or more substituents each independently selected from alkyl (preferably methyl), alkoxy (preferably methoxy or ethoxy), halogen (preferably chlorine or bromine), or nitro.

3. An electroluminescent device as claimed in claim 1, wherein the thin dense polymer film is of substantially uniform thickness in the range of 10 nm to 5 μm.

4. An electroluminescent device as claimed in claim 4, wherein the conjugated polymer has a semiconductor band gap in the range 1 eV to 3.5 eV.

5. An electroluminescent device as claimed claim 1, wherein the proportion of the conjugated polymer in electroluminescent areas of the polymer film is sufficient to achieve the percolation threshold for charge transport in the conjugated polymer present in the film.

6. An electroluminescent device as claimed claim 1, wherein the first charge injecting contact layer is a thin layer of aluminium one surface having formed a thin oxide layer, the first surface of the semiconductor layer being in contact with the said oxide layer.

7. An electroluminescent device as claimed claim 1, wherein the first contact layer is selected from the group comprising aluminium or an alloy of magnesium and silver.

8. An electroluminescent device as claimed in claim 6, wherein the second charge injecting contact layer is selected from the group comprising aluminium and gold.

9. An electroluminescent device as claimed claim 1, wherein at least one of the first and second charge injecting contact layers is at least semitransparent.

10. An electroluminescent device as claimed in claim 7, wherein the second contact layer comprises indium oxide or indium tin oxide.

11. An electroluminescent device as claimed claim 1 wherein the first contact layer comprises amorphous silicon and the second contact layer is selected from the group comprising aluminium, gold and indium oxide.

12. An electroluminescent device as claimed in claim 1, wherein at least of one of the first and second charge injecting contact layers is also in contact with a supporting substrate.

13. An electroluminescent device as claimed in claim 9, wherein the supporting substrate is silica glass.

14. An array of electroluminescent devices, each electroluminescent device as claimed in claim 1, said first and second charge injecting contact layers being arranged to permit selective addressing in said array.

* * * * *

UNITED STATES PATENT AND TRADEMARK OFFICE
CERTIFICATE OF CORRECTION

PATENT NO. : 5,247,190
DATED : September 21, 1993
INVENTOR(S) : Friend et al.

It is certified that error appears in the above-indentified patent and that said Letters Patent is hereby corrected as shown below:

In the abstract, line 7, "firm" should read --film--.

Column 5, line 59, "(phenylinevinylene)" should read --(phenylenevinylene)--.

Column 6, line 39, "initators" should read --initiators--.

Column 14, claim 4, line 2, "4" should read --1--.

Signed and Sealed this

Fourteenth Day of March, 1995

Attest:

BRUCE LEHMAN

*Attesting Officer*       *Commissioner of Patents and Trademarks*

UNITED STATES PATENT AND TRADEMARK OFFICE
CERTIFICATE OF CORRECTION

PATENT NO. : 5,247,190
DATED : September 21, 1993
INVENTOR(S) : Friend et al.

It is certified that error appears in the above-indentified patent and that said Letters Patent is hereby corrected as shown below:

Column 13, line 11, claim 1, "layers" should read --layer--.

Signed and Sealed this

Thirteenth Day of June, 1995

*Attest:*

BRUCE LEHMAN

*Attesting Officer*     *Commissioner of Patents and Trademarks*